(12) United States Patent
Kizer et al.

(10) Patent No.: US 8,352,772 B2
(45) Date of Patent: Jan. 8, 2013

(54) REFERENCE CLOCK AND COMMAND WORD ALIGNMENT

(75) Inventors: Jade M. Kizer, Durham, CA (US); Richard E. Perego, Thornton, CO (US)

(73) Assignee: Rambus Inc., Sunnyvale, CA (US)

( * ) Notice: Subject to any disclaimer, the term of this patent is extended or adjusted under 35 U.S.C. 154(b) by 359 days.

(21) Appl. No.: 12/598,068

(22) PCT Filed: May 8, 2008

(86) PCT No.: PCT/US2008/005985
§ 371 (c)(1),
(2), (4) Date: Oct. 29, 2009

(87) PCT Pub. No.: WO2008/153652
PCT Pub. Date: Dec. 18, 2008

(65) Prior Publication Data
US 2010/0128542 A1    May 27, 2010

Related U.S. Application Data

(60) Provisional application No. 60/931,922, filed on May 25, 2007.

(51) Int. Cl.
*G06F 1/04* (2006.01)
*G06F 1/14* (2006.01)
*G06F 11/00* (2006.01)

(52) U.S. Cl. ........ 713/503; 713/500; 713/501; 711/100; 710/5

(58) Field of Classification Search .................. 713/500, 713/501, 503; 711/100; 710/5
See application file for complete search history.

(56) References Cited

U.S. PATENT DOCUMENTS

| 6,871,051 B1 | 3/2005 | Barr et al. | |
|---|---|---|---|
| 6,999,543 B1 * | 2/2006 | Trinh et al. | 375/355 |
| 7,092,466 B2 * | 8/2006 | Hwang et al. | 375/355 |
| 7,397,847 B2 * | 7/2008 | Ishida et al. | 375/226 |
| 7,609,770 B2 * | 10/2009 | Chiang | 375/242 |
| 7,684,531 B2 * | 3/2010 | Masui et al. | 375/355 |
| 7,734,965 B1 * | 6/2010 | Barash | 714/712 |
| 7,936,809 B2 * | 5/2011 | Daxer et al. | 375/221 |

(Continued)

FOREIGN PATENT DOCUMENTS

GB    2336075    10/1999

OTHER PUBLICATIONS

Kilbuck, Kevin, "FBDIMM Unleashing Server Memory Capacity," Micron Technology Inc. Mar. 31, 2005. 108 pages.

(Continued)

*Primary Examiner* — Jaweed A Abbaszadeh
(74) *Attorney, Agent, or Firm* — Silicon Edge Law Group LLP; Arthur J. Behiel

(57) ABSTRACT

A memory system includes a memory controller that issues command signals and a reference-clock signal to a memory device. The edge rate of the reference-clock signal is lower than the bit rate of the command signals, so the memory device multiplies the reference clock signal to develop a command-recovery clock signal with which to sample the incoming command signals. The memory controller issues the command signals as a series of multi-bit command words aligned with edges of the reference-clock signal so that the memory device can use edges of the reference clock signal for command-word alignment.

14 Claims, 3 Drawing Sheets

U.S. PATENT DOCUMENTS

| | | | |
|---|---|---|---|
| 8,032,916 B2 * | 10/2011 | Oyadomari et al. | 725/119 |
| 2005/0276142 A1 | 12/2005 | Pelley | |
| 2006/0047899 A1 * | 3/2006 | Ilda et al. | 711/113 |
| 2006/0129703 A1 * | 6/2006 | Oshikawa et al. | 710/14 |
| 2008/0063129 A1 * | 3/2008 | Voutilainen | 375/376 |

OTHER PUBLICATIONS

Intel Corporation, "FB-DIMM-Scaling Memory Capacity on Intel Architecture Server Platforms." Copyright 2005. 7 pages.

JEDEC Standard, "FBDIMM Specification: High Speed Differential PTP Link at 1.5 V," JESD8-18. Sep. 2006. 15 pages.

Jeddeloh, Joe, "FBDIMM Architecture and Protocol, GM Advanced Systems Technology," Micron Technology, Inc. Mar. 31, 2005. 82 pages.

Dated Feb. 23, 2012 for PCT/US08/05985—"Notification of Transmittal of International Preliminary Report on Patentability" (Form PCT/IPEA/416); PCT "International Preliminary Report on Patentability" (Form PCT/IPEA/409); and also included with these 2 forms is the Statement Under Article 19 (1) with amended claims.

* cited by examiner

REFERENCE CLOCK AND COMMAND WORD ALIGNMENT

FIELD

The subject matter disclosed herein relates generally to the field of communications, and more particularly to high speed electronic signaling within and between integrated circuit devices.

BACKGROUND

Integrated circuits (ICs) often include disparate types of integrated devices that exhibit different speed performance. In a common example, typical integrated memory devices include input and output (I/O) circuitry that communicates with arrays of memory cells. I/O circuitry and memory cells are typically implemented using markedly different circuit technologies, and consequently exhibit performance asymmetry that complicates optimization of overall device performance. Adding still more complexity, performance improves at different rates for different circuit technologies, so performance disparities between circuits common to a given IC device can increase over time.

In a specific example, dynamic-random-access memory (DRAM) IC devices include I/O circuitry that communicates data between a memory core and an external memory controller. The speed performance of the I/O circuitry has been increasing faster than that of the memory core. The resulting performance asymmetry enables DRAM IC devices to reduce the requisite number of command, address, and data lines. However, as the I/O speed performance continues to increase, DRAM devices may have trouble processing commands as fast as the I/O circuitry is capable of delivering them.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
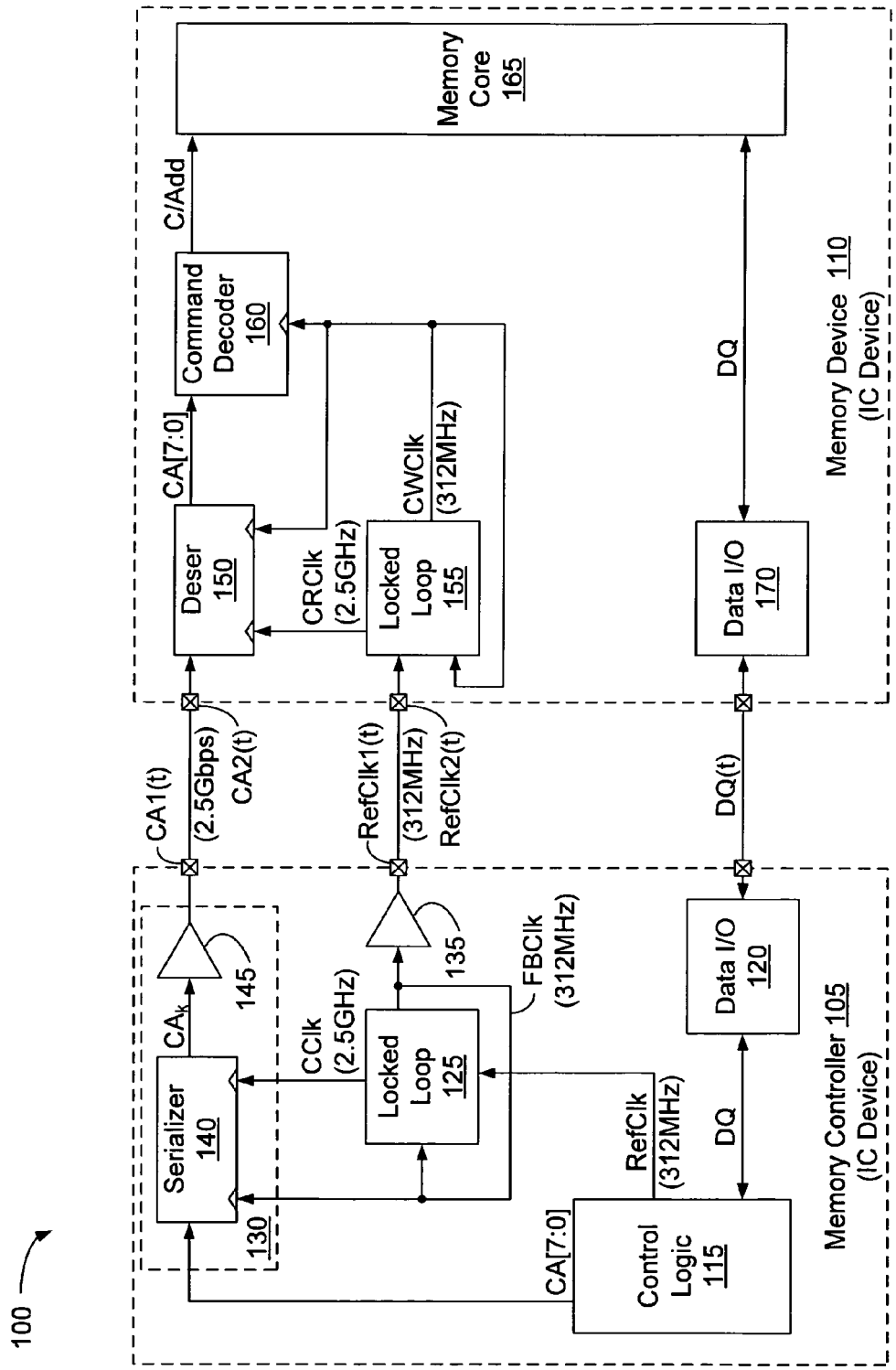
FIG. 1 depicts a memory system 100 that communicates serial memory command signals in multi-bit words timed to a reference clock signal.

FIG. 1 depicts a memory system 100 in which a memory controller 105 issues command signals and a reference-clock signal to a memory device 110. The edge rate of the reference-clock signal is lower than the bit rate of the command signals, so memory device 110 multiplies the reference clock signal to develop a command-recovery clock signal with which to sample the incoming command signals. Memory controller 105 issues the command signals as a series of multi-bit command words, or frames, aligned with edges of the reference-clock signal. Memory device 110 can thus use edges of the reference clock signal for command-word alignment. Using the reference clock to facilitate word alignment relaxes the timing requirements for command decoding at memory device 110.

Memory device 105 includes control logic 115, data input/output (I/O) 120, a locked loop 125, a command interface 130, and a clock buffer 135. Command interface 130 includes a serializer 140 and a pulse modulator 145. Control logic 115 issues command and address signals to a command interface 130 as eight-bit words synchronized to edges of a reference clock signal RefClk. The reference clock signal can be sourced within control logic 115 or elsewhere. For example, a reference clock signal external to both devices 105 and 110 can be used for synchronization. Control logic 115 also writes and reads data DQ to and from device 110 via data I/O 120. The manner in which data I/O 120 communicates data is outside the scope of the present disclosure, as many suitable circuits are well understood by those of skill in the art.

Locked loop 125 locks the phase and frequency of a feedback clock FBClk with reference clock RefClk by adjusting the phase, frequency, or both, of the feedback clock. Feedback clock FBClk is then conveyed to serializer 140 to sample parallel command and address words CA[7:0], which are alternatively referred to as "command words" CA[7:0] for brevity. Locked loop 125 additionally derives a relatively high-frequency command-clock signal CClk from reference clock signal RefClk. Clock buffer 135, a liner pulse modulator, converts feedback clock FBClk into continuous-time format as a reference clock RefClk1($t$) on a like-named output pad of IC 105. (In general, the various signal labels herein refer to both the signal and the corresponding circuit node. Whether a given designation refers to a node or a signal will be clear from the context.)

Serializer 140 serializes command words CA[7:0] into discrete-time signal $CA_k$. Pulse modulator 145 converts the discrete-time signal into continuous-time format as command signal CA1($t$) on a like-named output pad. Signals $CA_k$ and CA1($t$) are timed to clock signal CClk, and so are conveyed at a bit rate that is higher than the frequency of reference clock signal RefClk1($t$). In the instant example, reference clock signal RefClk1($t$) has a frequency of 312 MHz, and the bit rate of command signal CA($t$) is 2.5 Gbps. The reference and command-sampling frequencies may have different relationships in other embodiments. In each case, however, the edge rate of the reference clock signal (i.e., the number of clock edges per second, or twice the clock frequency) is less than the bit rate of the serial command signals. Reference clock signal RefClk2($t$) at the input of memory device 110 thus has insufficient positive- or negative-going edges to sample the incoming command signal CA2($t$).

Device 110 includes a deserializer 150, a locked loop 155, a command decoder 160, a memory core 165, and data I/O circuitry 170. Locked loop 155 derives a command-recovery clock signal CRClk and a command-word clock signal CWClk reference clock signal RefClk2($t$), which is a version of clock signal RefClk1($t$) delayed by the channel separating IC devices 105 and 110. Command clock signal CClk is of the same frequency of reference clock signal RefClk2($t$) and is used as the feedback clock signal for locked loop 155. The frequency of command-recover clock signal CRClk is eight times that of clock signal CWClk, 2.5 GHz and 312 MHz respectively in this example. Deserializer 150 only samples signal CA2($t$) on rising edges of command-recovery clock signal CRClk, so the sampling rate of deserializer 150 is 2.5 billion samples per second. Deserializer 150 can sample signal CA2($t$) on both clock edges in other embodiments.

Deserializer 150 samples command signal CA2($t$), a delayed version of command signal CA1($t$), on edges of clock signal CRClk and presents corresponding eight-bit words CA[7:0] timed to clock signal CWClk. As noted previously, control logic 115 in controller 105 synchronizes command words CA[7:0] with edges of reference clock RefClk1($t$). This timing relationship is preserved between controller 105 and device 110 so that deserializer 150 sequentially issues command words to command decoder 160. Because edges of the reference clock signal delineate command words, command decoder 160 need not implement traditional pattern-based word-alignment methods that operate at the bit rate of the incoming command signal CA2($t$). Command decoders that operate at the relatively high frequency of the input circuitry that receives the serial command signals can lose calibrated state information with glitches and power cycling. Reducing the command decoder operating frequency, from 2.5 GHz to 312 MHz in this example, significantly reduces the timing constraints of the command decoder. Command decoder 160 can be adapted to perform additional word alignment calibration, albeit at a lower frequency than that of the input circuitry within deserializer 150.

Command decoder 160 decodes command words CA[7:0] to issue appropriately formatted command and address signals C/Add for memory core 165. Memory core 165 responds to appropriately formatted command and address signals by communicating data signal DQ with memory controller 105 (read or write) via data I/O circuitry 170. Command decoders are well understood by those of skill in the art, so a detailed discussion of command decoder 160 is omitted for brevity. Memory core 165 and data I/O circuitry 170 are likewise well understood, so detailed discussions of these elements are likewise omitted.

Figure 2:
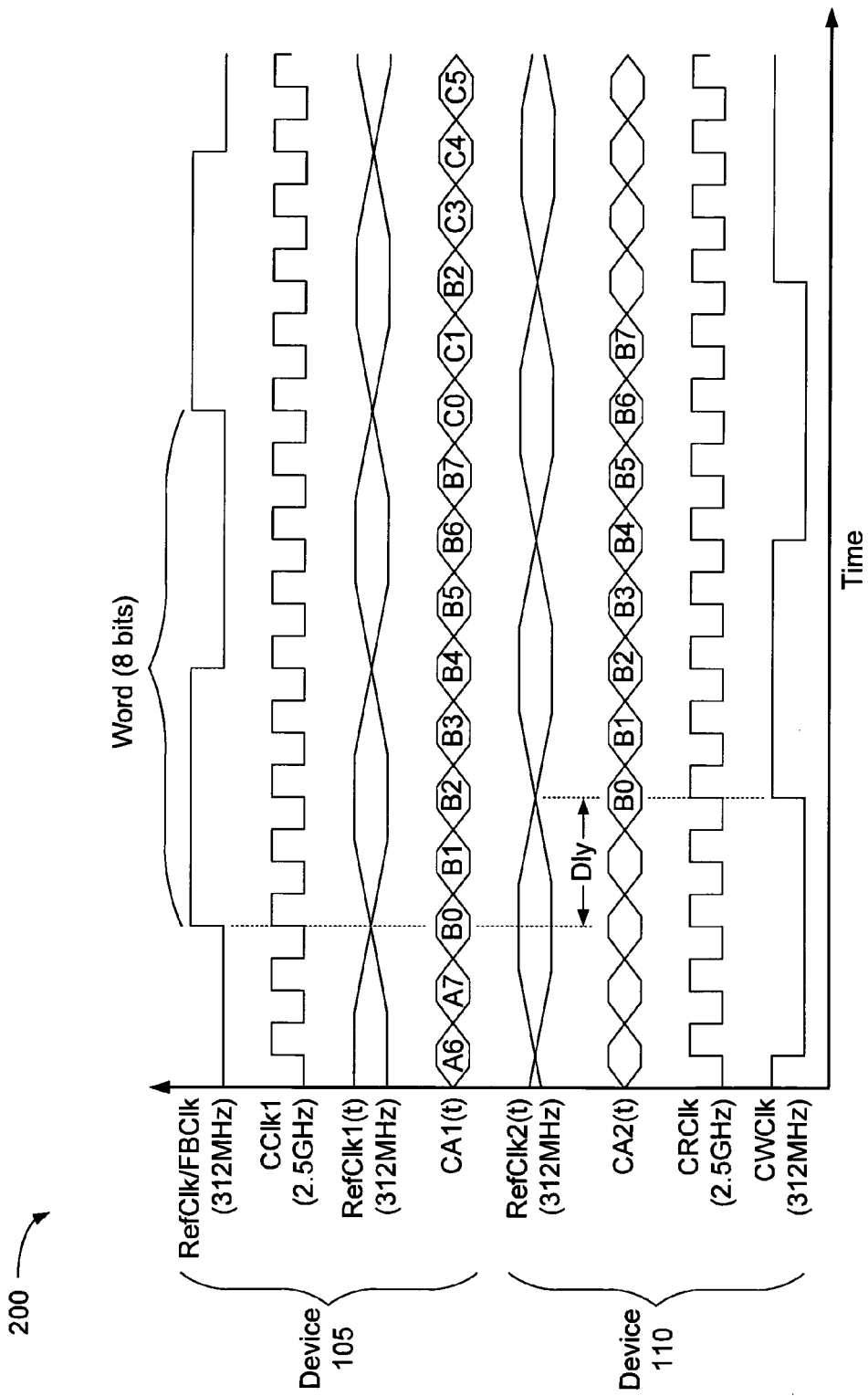
FIG. 2 is a diagram 200 depicting hypothetical waveforms for corresponding nodes in system 100 of FIG. 1, and is used in connection with FIG. 1 to describe the operation of a system in accordance with one embodiment.

FIG. 2 is a diagram 200 depicting hypothetical waveforms for corresponding nodes in system 100 of FIG. 1, and is used in connection with FIG. 1 to describe the operation of a system in accordance with one embodiment. The first four waveforms are associated with controller 105, whereas the last four are associated with device 110.

Control logic 115 times each command word CA[7:0] to an edge of feedback clock signal FBClk, and thus to reference clock signal RefClk. Command interface 130 serializes these words using clock signal CClk so that controller 105 transmits command signals as serial, continuous-time signals CA1($t$) in which each bit represents one of eight bits in a serialized command word. In the example of FIG. 2, controller 105 aligns the zero bit of each serialized word in command signal CA1($t$) with edges of reference clock signal RefClk1($t$) and transmits the resulting command and timing signals to device 110. For example, a command word B[7:0] expressed in command signal CA1($t$) is depicted in waveform diagram 200 such that bit B0 is aligned with an edge of reference clock signal RefClk1($t$).

The command and timing-reference signals each experience some delay Dly in transit between controller 105 and memory device 110. Delay Dly is matched for the command and reference clock signals such that the timing relationship is preserved. One or both of devices 105 and 110 can include variable delay elements (not shown) to match the delays imposed on the command and timing-reference signals, and the reference clock edges can be aligned to different bits, additional bits, or both. Command signal CA1($t$) is expressed as parallel bitstreams in other embodiments, in which case the timing of the individual bitstreams can be adjusted to arrive at memory device 110 simultaneously.

Locked loop 155 recovers command-word clock signal CWClk from received reference clock signal RefClk2($t$) and additionally generates the higher-frequency command recovery clock signal CRClk. Deserializer 150 recovers incoming command signals CA2($t$) using clock signal CRClk and delivers parallel words CA[7:0] to command decoder 160 at the clock rate defined by clock signal CWClk. Clock signal CWClk is phase aligned with the zero bit (e.g. bit B0) of the incoming command words so words CA[7:0] delivered to command decoder 160 preserve the word alignment defined by control logic 115. The command words are the same bit length in controller 105 and device 110 in this embodiment, but this need not be the case. Further, the sampling rate of clock signal CWClk need not be the same as the word rate of signal CA2($t$), and reference clock signal RefClk2($t$) need not be the same frequency as clock signal CWClk.

Figure 3:
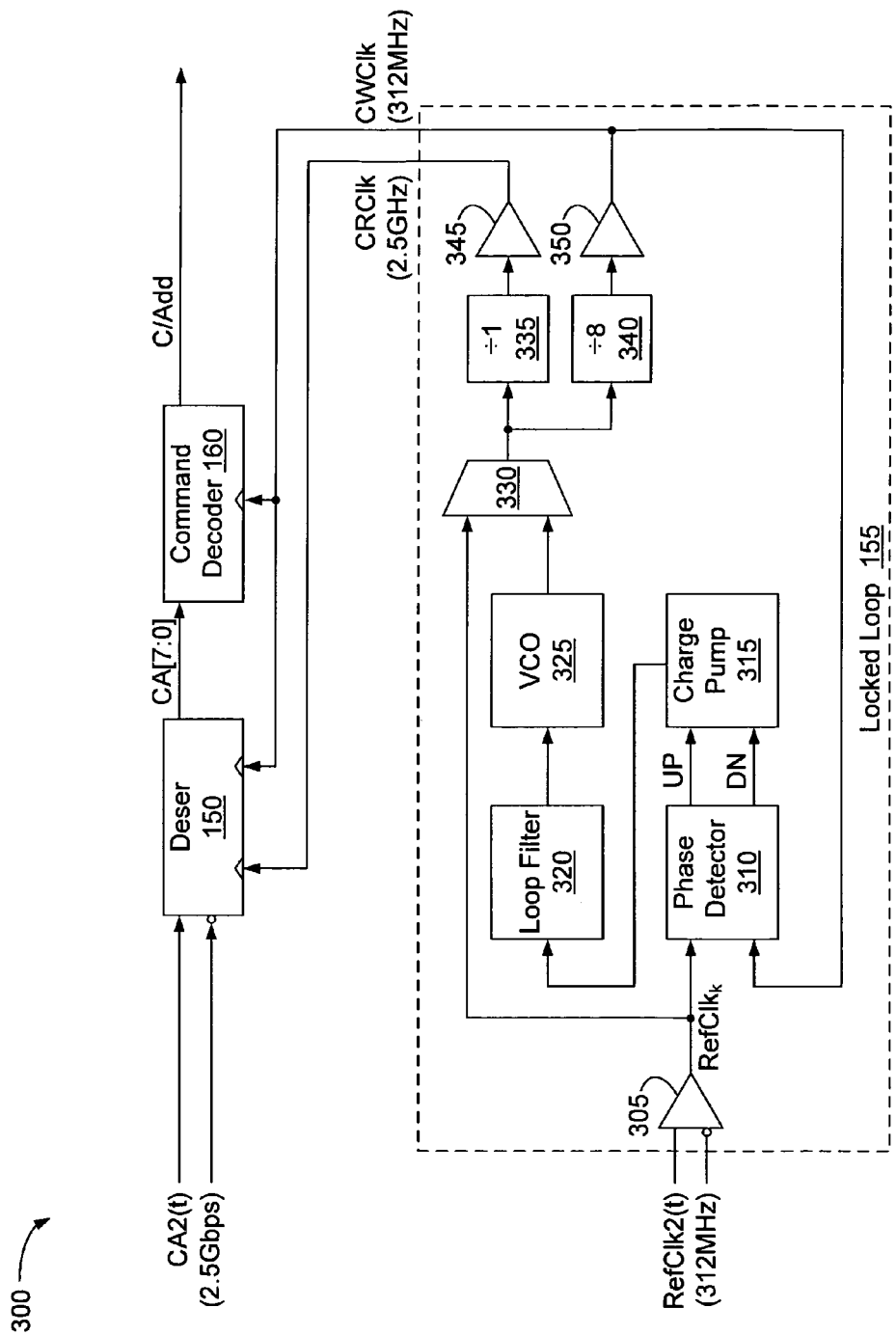
FIG. 3 is a diagram 300 depicting a portion of device 110 of FIG. 1, like-numbered elements being the same or similar, in which command and reference-clock signals CA(t) and RefClk(t) are differential signals and deserializer 150 and locked loop 155 are configured accordingly.

FIG. 3 is a diagram 300 depicting a portion of device 110 of FIG. 1, like-numbered elements being the same or similar, in which command and reference-clock signals CA2($t$) and RefClk2($t$) are differential signals and deserializer 150 and locked loop 155 are configured accordingly.

Locked loop 155 is a phase-locked loop (PLL) in this example, and includes a differential receiver 305, a phase detector 310, a charge pump 315, a loop filter 320, a voltage-controlled oscillator (VCO) 325, a multiplexer 330, a pair of clock dividers 335 and 340, and a pair of clock buffers 345 and 350. Multiplexer 330 is included to disable the PLL for testing. During PLL operation, multiplexer 330 couples the output terminal of VCO 325 to the input terminals of clock dividers 335 and 340. The following discussion assumes the PLL is operational. Locked loop 125 of controller 105 may be similar to locked loop 155, and one or both locked loops may be a delay locked loop (DLL).

In the embodiment of FIG. 3, phase detector 310 compares the phase of a recovered reference signal RefClk$_k$ to the phase of clock signal CWClk to generate phase-error signals UP and DN. To derive clock signal CWClk, frequency divider 340 divides the frequency of the output signal from VCO 325 by eight and feeds the resulting clock signal to an input of phase detector 310 via clock buffer 350. When the phase of signal CWClk lags behind that of reference signal RefClk$_k$, phase detector 310 generates an up control signal UP. When the phase of signal CWClk leads that of reference signal RefClk$_k$, phase detector 310 generates a down control signal DN. Charge pump 315 adds charge to its output lead to loop filter 320 upon receiving up control signal UP and drains charge from its output lead upon receiving down control signal DN.

Loop filter 320 is typically a low-pass filter that integrates the charge from charge pump 315 to present a control voltage on the input of VCO 325. The output frequency of the oscillating signal from VCO 325 rises and falls with the control voltage. Locked loop 155 thus varies the frequency of VCO 325 to maintain phase alignment between reference clock signal RefClk$_k$ and command-word clock signal CWClk. Clock divider 335 is included to match divider 340, and thus to maintain phase alignment between clock signals CWClk and CRClk. Deserializer 150 and command decoder 160 sample and interpret command signals CA2($t$) using clock signals CRClk and CWClk as described above in connection with FIGS. 1 and 2. PLLs are well understood by those of skill in the art, so a detailed discussion of locked loop 155 is omitted for brevity.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Finally, embodiments of the invention may be adapted for use with multi-pulse-amplitude-encoded (multi-PAM) signals.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on a computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, 1. memory controller 105 can communicate with multiple memory devices using the same command and address bus;
2. the reference clock can be provided from a clock source external to the memory controller; and
3. the command words may be more or fewer bits.

Moreover, some components are shown directly connected to one another while others are shown connected via intermediate components. In each instance the method of interconnection, or "coupling," establishes some desired electrical communication between two or more circuit nodes (e.g., pads, pins, or terminals). Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A receiver comprising:
    a signal node to receive an input signal at a first bit rate, the input signal expressed as a sequence of multi-bit words;
    a clock node to receive a reference clock signal having a plurality of reference-clock edges, a respective one of the plurality of reference clock edges aligned to a corresponding bit of each of the multi-bit words and an edge rate less than the first bit rate;
    a locked loop coupled to the clock node, the locked loop to derive from the reference clock signal a bit-recovery clock signal exhibiting a first sampling rate equal to the first bit rate, and to derive from the reference clock signal a word clock signal having respective word-clock edges aligned to each of the corresponding bits of the words; and
    a deserializer having a deserializer input node coupled to the signal node, a first deserializer clock node coupled to the locked loop to receive the bit-recovery clock signal, and a second deserializer clock node coupled to the locked loop to receive the word clock signal, the deserializer to sample the input signal with the bit-recovery clock signal at the first sampling rate to recover the multi-bit words, and to deserialize the multi-bit words to produce parallel words synchronized to the word clock signal.

2. The receiver of claim 1, further comprising a command decoder coupled to an output of the deserializer to receive the parallel words, wherein the command decoder captures the parallel words responsive to the word clock signal.

3. The receiver of claim 2, further comprising a memory core coupled to an output of the command decoder, wherein each parallel word comprises a memory command signal.

4. The receiver of claim 1, wherein each multi-bit word includes a first bit, and wherein the locked loop aligns the edges of the word clock signal with the first bits of the multi-bit words.

5. The receiver of claim 1, wherein the locked loop includes a phase detector to compare the phases of the reference clock signal and the word clock signal.

6. A memory system comprising:
    a memory controller having:
        a first locked loop to issue a command-clock signal at a bit rate and a reference-clock signal at an edge rate less than the bit rate;
        a first pad to issue serial command signals at the bit rate, the serial commands expressed as a sequence of multi-bit words;
        a second pad to issue the reference-clock signal at the edge rate lower than the bit rate; and
        control logic coupled to the first locked loop to define a word alignment between the words and the reference-clock signal; and
    a memory device having:
        a third pad coupled to the first pad to receive the serial command signals;
        a fourth pad coupled to the second pad to receive the reference-clock signal;
        a second locked loop coupled to the third pad, the second locked loop to derive a command-recovery clock signal and a command-word clock signal from the reference-clock signal, the second locked loop to phase align the command-word clock signal with the multi-bit words of serial command signals to preserve the word alignment from the memory controller;
        a deserializer coupled to the locked loop, the deserializer to sample the command signals with the command-recovery clock signal at a first sampling rate and to issue command words at a second rate timed to the command-word clock signal; and
        a command decoder coupled to the deserializer.

7. The system of claim 6, wherein the memory device further comprises a dynamic random-access memory core coupled to the command decoder.

8. The system of claim 6, wherein the memory controller further includes a serializer coupled between the control logic and the first pad, the serializer to receive parallel words from the control logic and serialize the parallel words to convey the sequence of multi-bit words.

9. The system of claim 6, wherein the command decoder decodes the command words at the second rate.

10. The system of claim 6, further comprising a second memory device having a fifth pad coupled to the first pad to receive the serial command signals.

11. A non-transitory computer-readable medium having stored thereon a data structure defining a receiver, the data structure comprising:
- first data representing a signal node to receive an input signal at a bit rate, the input signal expressed as a sequence of multi-bit words;
- second data representing a clock node to receive a reference clock signal having a plurality of reference-clock edges, a respective one of the plurality of reference clock edges aligned to a corresponding bit of each of the multi-bit words and an edge rate less than the bit rate;
- third data representing a locked loop coupled to the clock node, the locked loop to derive from the reference clock signal a command-recovery clock signal exhibiting a sampling rate equal to the bit rate, and to derive from the reference clock signal a word clock signal having respective word-clock edges aligned to each of the corresponding bits of the words; and
- fourth data representing a deserializer having a deserializer input node coupled to the signal node and a deserializer clock node coupled to the locked loop, the deserializer to sample the input signal with the command-recovery clock signal at the sampling rate.

12. A memory device comprising:
- a first node to receive, at a bit rate, a command signal divided into a series of multi-bit command words;
- a second node to receive a reference-clock signal having a plurality of reference-clock edges, a respective one of the plurality of reference-clock edges aligned to a corresponding bit of the multi-bit words, and an edge rate lower than the bit rate;
- means for deriving first and second command clock signals from the reference clock signal, the first command clock signal having a sampling rate equal to the bit rate and the second command clock signal having a second rate less than the sampling rate and command-clock edges aligned to the corresponding bits of the words; and
- means for dividing the command words into parallel words and conveying the parallel words at the second rate.

13. The memory device of claim 12, further comprising a memory core and means for decoding the parallel words into second commands and applying the second commands to the memory core.

14. A system comprising:
- a first integrated circuit (IC) to issue a series of multi-bit words at a bit rate and a reference clock signal at an edge range lower than the bit rate, the first IC including control logic to define a word alignment between the words and edges of the reference-clock signal; and
- a second IC coupled to the first IC to receive the words and reference-clock signal, the second IC having:
  - a locked loop to derive a recovery clock signal and a word clock signal from the reference-clock signal, the locked loop to phase align the word clock signal with the words to preserve the word alignment from the first IC; and
  - a deserializer coupled to the locked loop, the deserializer to sample the bits of the multi-bit words with the recovery clock signal at the bit rate and to issue the words as parallel bits timed to the word clock signal.

* * * * *